Nov. 23, 1965 T. S. BENEDICT 3,219,891

SEMICONDUCTOR DIODE DEVICE FOR PROVIDING A CONSTANT VOLTAGE

Filed Sept. 18, 1961

INVENTOR
THEODORE S. BENEDICT
BY
ATTORNEY

United States Patent Office 3,219,891
Patented Nov. 23, 1965

3,219,891
SEMICONDUCTOR DIODE DEVICE FOR PROVIDING A CONSTANT VOLTAGE

Theodore S. Benedict, Fanwood, N.J., assignor to Merck & Co., Inc., Rahway, N.J., a corporation of New Jersey Filed Sept. 18, 1961, Ser. No. 138,874
6 Claims. (Cl. 317—234)

This invention relates generally to semiconductor devices and, more particularly, to a composite semiconductor device which is adapted to provide a substantially constant output voltage.

The utilization of semiconductor diodes having certain electrical characteristics in the reverse voltage breakdown region, sometimes referred to as the Zener voltage, is well known in the prior art. Such devices are normally utilized directly for regulation purposes in simple voltage regulation circuits connected at the output of a power supply. In some instances, such diodes are utilized to provide a source of constant reference voltage in more complicated voltage or current regulating circuits.

In all presently known circuits wherein semiconductor diodes are utilized in the reverse voltage breakdown region a resistive circuit element is connected to the diodes to provide protection from excessive current flow therethrough. These resistive circuit elements have in the past been separate circuit components and in no way an integral part of the semiconductor element.

Under the present-day micro-miniaturization techniques, the utilization of the individual circuit components as resistive elements with semiconductor diodes is undesirable particularly in those instances wherein the size, space or weight of an over-all electrical or electronic circuit is of importance.

Accordingly, it is an object of the present invention to provide a composite semiconductor Solid Circuit * which is capable of providing a relatively constant output voltage, and which may be utilized for such a purpose independently of separately formed passive circuit components.

It is another object of the present invention to provide a composite semiconductor Solid Circuit which is exceedingly small and is capable of being utilized in micro-miniaturized equipment for the purpose of providing a relatively constant output voltage.

It is another object of the present invention to provide a semiconductor Solid Circuit which may independently be used as a simple voltage regulator in a power supply.

Additional objects and advantages of the present invention will become apparent from a consideration of the following description taken in conjunction with the accompanying drawing which is presented by way of example only and is not intended as a limitation upon the scope of the claims of the present invention as appended hereto, and in which:

In accordance with one aspect of the present invention, a composite semiconductor device for providing a substantially constant voltage includes first and second layers of semiconductor material having opposite conductivity types and being separated by a P-N junction. A semiconductor resistive element is affixed integrally to one of

*Reg. T.M.

the layers of semiconductor material. Electrical ohmic connections are made to the resistive element and to each of the layers of semiconductor material to provide the desired device.

More specifically, in accordance with the present invention, two layers of single crystalline semiconductor material are vapor-deposited and are separated by a P-N junction. Also vapor-deposited and crystallographically interconnected to one of the layers of semiconductor material is a layer of relatively high resistivity semiconductor material. Electrical ohmic connections are then applied as above outlined to provide a desired structure.

Figure 1:
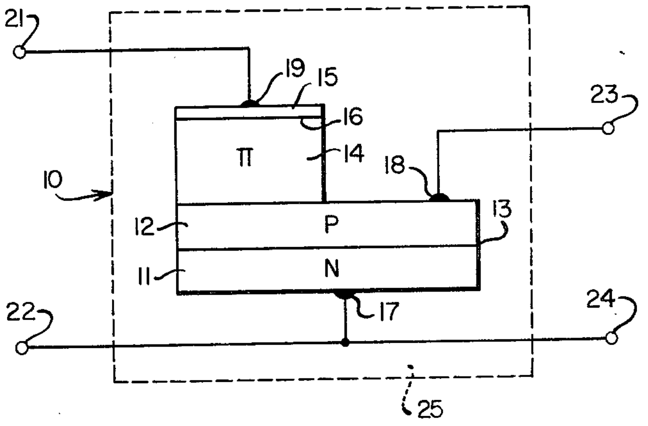
FIG. 1 is a schematic representation of a composite semiconductor device in accordance with the present invention.

Referring now to the drawing, and more particularly to FIG. 1 thereof, there is illustrated a semiconductor device 10 in accordance with the present invention. The semiconductor device 10 includes first and second layers 11 and 12 of semiconductor material which are separated by a P-N junction 13. The layers of semiconductor material 11 and 12 preferably are substantially single crystalline, and are of opposite conductivity type, as is indicated by the letters "N" and "P," disposed within the layers 11 and 12, respectively. Crystallographically interconnected to the layer 12 of semiconductor material is an additional layer 14 of semiconductor material which has a relatively high resistivity as compared to either of the layers 11 and 12 of the semiconductor material. Again it is preferable that the layer 14 of semiconductor material be substantially single crystalline. Affixed as an integral part of the layer 14 and to the upper portion thereof, is an additional layer 15 of semiconductor material which is separated from the layer 14 by a transition region 16. Preferably the layer 15 is highly doped semiconductor material which is crystallographically interconnected with the layer 14 and aids in providing an ohmic connection to the layer 14. Ohmic connections 17 and 18 are provided to the layers 11 and 12, respectively, of semiconductor material. An ohmic connection 19 is provided to the highly doped layer 15 of semiconductor material. Input terminals 21 and 22 are affixed to the ohmic connections 19 and 17 while output terminals 23 and 24 are affixed to the ohmic connections 18 and 17, respectively. The entire device may be encapsulated within any desired encapsulant as is illustrated by the dashed line 25. The only criterion is that the input and output terminals be exposed for the purpose of attaching the semiconductor device in the desired circuit configuration.

The semiconductor device as illustrated in FIG. 1 may be constructed of any semiconductor material presently known to the art. For example, the semiconductor device 10 may be constructed of silicon, germanium, silicon-germanium alloy, silicon-carbide, group III–V intermetallic compounds such as gallium-arsenide, indium-phosphide, aluminum-antimonide, indium-antimonide and the like. However, for the purposes of description only, the remaining discussion of the semiconductor device in accordance with the present invention will given with particular reference to the use of silicon as the semiconductor material.

The device as illustrated in FIG. 1 and above described may be constructed in any manner which is desired. However, preferably such a semiconductor device is formed in accordance with the teachings of patent application Serial No. 27,938 filed May 9, 1960 now Patent No. 3,088,463 by John E. Allegretti and James Lago and which is assigned to the assignee of the present application. As is disclosed in the Allegretti et al. application, silicon semiconductor material along with a first predetermined concentration of active impurity material may be deposited upon a heated, essentially single crystalline silicon semiconductor starting element from a decomposable source thereof in a reactor chamber. After a predetermined period of time during which the desired thickness of semiconductor material has been deposited, the concentration of the active impurity material within the decomposable source material is changed to provide a second layer of silicon semiconductor material having a desired resistivity. If such is desired, not only the concentration but also the conductivity determining type of the active impurity material may also be changed. After a second predetermined period of time during which the desired thickness of the second layer of semiconductor material has ben deposited upon the first deposited layer of semiconductor material, the concentration of the active impurity material contained within the decomposable source may then be again changed to provide an additional layer of semiconductor material having the desired resistivity. After a third predetermined period of time during which the desired thickness of the next layer of semiconductor material has been deposited, the source material and active impurity material is removed from the reaction chamber. The starting element with the various layers of silicon semiconductor material vapor-deposited thereon is permitted to cool and is then removed from the chamber.

Figures 2, 3, 4:
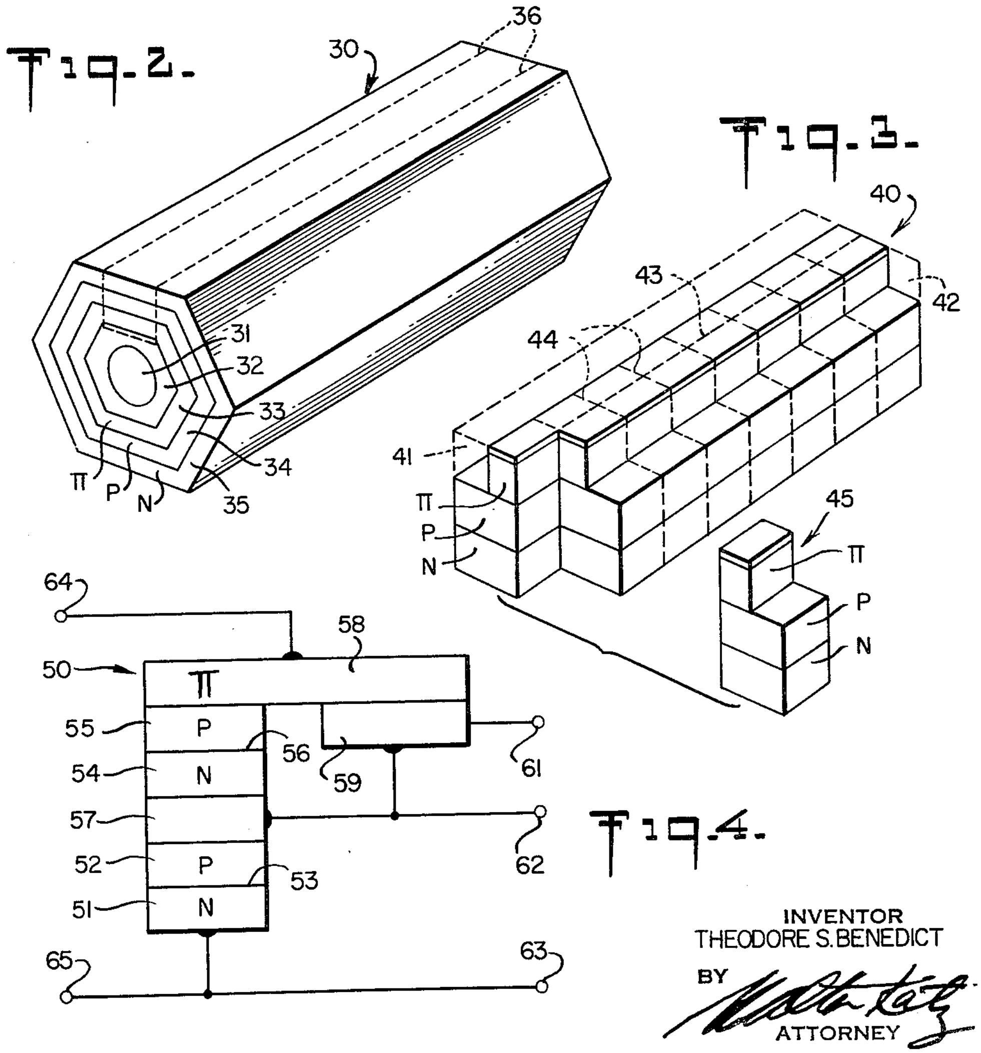
FIGS. 2 and 3 are schematic illustrations of a semiconductor device in accordance with the present invention at various stages of production thereof.
FIG. 4 is a schematic representation of an alternative embodiment of a semiconductor device in accordance with the present invention.

Such a structure is as illustrated in FIG. 2 and, for example, includes a core or starting element 31 which has vapor-deposited thereon a layer of silicon semiconductor material 32 which, in the present invention, may be a highly doped P+ type layer to provide the layer 15 above described in conjunction with FIG. 1. After the deposition of layer 32 has been carried to an extent to provide the polygonal structure as illustrated in FIG. 2, the concentration of the active impurity material in the source material is changed to provide the high resistivity layer 33 as illustrated in FIG. 2. The purpose of the high resistivity layer which is designated by the symbol $\pi$ in the drawings will be described more fully hereinafter.

After the deposition of the desired thickness of the high resistivity layer 33, the concentration of active impurity material contained within the decomposable silicon source material may then be increased in order to provide the P-type layer 34 which is disposed about the high resistivity type layer 33. After the desired thickness of the P-type layer has been formed, the conductivity determining type of active impurity material contained within the decomposable silicon source may be changed to provide N-type silicon semiconductor layer 35. After the deposition of the layers 32 through 35 upon the silicon starting element 31, the decomposable source and active impurity materials are exhausted from the reaction chamber and the resulting structure permitted to cool after which it is removed from the reaction chamber for further processing.

At this point, a section or bar may be cut from the rod 30 and is illustrated by the dashed lines 36 in FIG. 2. The resulting bar or rod which is illustrated at 40 in FIG. 3, and to which reference is hereby made, may then have the upper corner portions thereof removed by well known techniques, such as sewing or etching. The portions removed are illustrated in dashed lines 41 and 42 of FIG. 3. The remaining structure as illustrated in heavy lines in FIG. 3 may then be diced as is illustrated by the dashed lines 43 and 44 to provide a plurality of semiconductor devices 45 of the type described and illustrated in conjunction with FIG. 1 above.

The structure as illustrated in FIG. 1 and which is vapor-deposited as described in conjunction with FIGS. 2 and 3, may be utilized as a voltage regulator in the following manner. The layers 11 and 12 of semiconductor material are formed during the vapor deposition thereof to provide the characteristics desired for a diode which will operate in the reverse voltage breakdown region. This region is oftentimes referred to as the Zener voltage. To provide the desired current through the Zener diode represented by the layers 11 and 12 of semiconductor material, it is necessary to provide a current limiting resistor in series with the diode. The current limiting resistor is illustrated in FIG. 1 by the high resistivity layer 14 of semiconductor material. The thickness and the resistivity of the material 14 is provided to obtain the desired current flow through the diode. The output signal from the voltage regulator is taken across the terminals 23, 24 which provide a constant output voltage irrespective of variations of current which may flow through the combination of the diode and the resistor as above described.

It is therefore seen that a composite structure contained within one housing is provided and operates to provide a substantially constant output voltage which, if desired, may be directly utilized as a regulated supply voltage to any desired utilizing apparatus. If such is desired, however, the structure as illustrated in FIG. 1 may be utilized to provide a constant reference voltage in additional and more complex regulator circuits which are utilized in power supplies and which are well known to the prior art, and therefore will not be discussed at any greater length herein.

In some instances, it is desirable to provide a plurality of output voltages by utilizing a series of Zener diodes, each of which provides a constant output voltage or the combination of which may provide a constant output voltage. In such instances, it is oftentimes found that the current flow through one of the diodes in such a structure is substantially greater than that which would appear through the remaining diodes. In such instances, it has been found also that the amount of current flowing through one of the diodes may have a tendency to exceed the rated current for that particular diode. In order to provide a composite semiconductor device capable of providing a plurality of relatively constant output voltages which will cope with the problem above referred to, the structure of FIG. 4 may be utilized.

As is illustrated in FIG. 4, a semiconductor device 50 in accordance with the present invention includes first and second layers 51 and 52 of silicon semiconductor material which are separated by a P-N junction 53. Also provided are layers 54 and 55 of silicon semiconductor material which are separated by a P-N junction 56. The layers 51 and 52 of semiconductor material provide one Zener diode, while the layers 54 and 55 provide a second Zener diode. An additional layer of semiconductor material 57 is provided between the layers 52 and 54 of semiconductor material and it is crystallographically interconnected therewith. Preferably, the layer 57 of semiconductor material is doped to the point that it becomes nothing more than a conductor and may therefore be considered degenerate semiconductor material. Such material forms no junction or barrier with the adjoining layers of semiconductor material and may be viewed simply as an electrical connection between the two diodes. Vapor-deposited in conjunction with the P-type layer 55 of silicon semiconductor material is an additional layer 58 of high resistivity semiconductor material. The layer 58 provides the normal series connected current limiting resistor of the type above referred to. Layer 59 of semiconductor material is also utilized as a semiconductor resistor which is connected in parallel with the diode comprised by layers 54 and 55 of semiconductor material, and in series with the resistor 58. Output terminals 61, 62 and 63 are provided to permit utilization of the output voltage from the device 50 as illustrated in FIG. 4. Input terminals 64 and 65 are utilized to connect the device 50 to the output of a normal power supply.

In operation, the output voltage from the power supply is applied to the input terminals 64 and 65 of the device 50. The diodes represented by layers 51, 52, 54 and 55 break down and operate in the commonly referred to Zener region of their voltage current characteristic curves. The semiconductor resistor 58 limits the current flowing through the two diodes so that it remains within the design region. The resistor 59 which is connected in parallel with the diode represented by layers 54, 55 of semiconductor material operates to divide the current flow between it and the diode to thereby prevent the current through the diode from exceeding its design capacity. The semiconductor device 50 as illustrated in FIG. 4 may be encapsulated in any manner which is desired and as above described.

Although two relatively simple embodiments of semiconductor devices which are vapor-deposited and which provide a relatively constant output voltage and which, if desired, may be utilized as Zener-type voltage regulators have been disclosed above, it should be expressly understood that additional and more complex structures may be constructed in accordance with the teachings of the present invention. It should therefore be expressly understood that such complex structures are to be included within the spirit and scope of the present invention as defined by the claims which are appended hereto.

What is claimed is:

1. A semiconductor device for providing a substantially constant voltage, comprising first and second substantially planar layers of substantially single crystalline semiconductor material of opposite conductivity types separated by a substantially planar P-N junction, said first and second layers of material being crystallographically interconnected; a first substantially planar semiconductor resistor crystallographically interconnected to one of said first and second layers of semiconductor material, said semiconductor resistor having a high resistivity compared to the resistivity of each of said first and second layers; a second substantially planar resistor of substantially single crystalline semiconductor material in series circuit relationship with said first resistor; means interconnecting said second resistor with said junction and crystallographically interconnecting said second resistor with said first resistor, said second resistor being crystallographically interconnected in parallel circuit relationship with said junction and being crystallographically interconnected with said first resistor; and electrical ohmic connections to each of said first and second resistors and to one of said first and second layers.

2. A semiconductor device for providing a substantially constant voltage, comprising a plurality of semiconductor diodes each of which is adapted to operate in its reverse voltage breakdown region, each of said semiconductor diodes comprising crystallographically connected first and second substantially planar layers of substantially crystalline semiconductor material of opposite conductivity types separated by a substantially planar P-N junction; a layer of degenerate semiconductor material sandwiched between adjacent diodes and affixed thereto to provide electrical series connection for said diodes; a vapor-deposited substantially planar resistor layer of high resistivity semiconductor material crystallographically interconnected with one of the first and second layers of an end one of said series of diodes, said resistor layer having a high resistivity compared to the resistivity of each of said first and second layers of the end diode; and electrical connections to said reistor layer of high resistivity semiconductor material and to said series of diodes to provide at least one substantially constant output voltage.

3. A semiconductor device as claimed in claim 2, wherein said degenerate layer of semiconductor material is crystallographically interconnected with each of the diodes disposed adjacent thereto.

4. A semiconductor device as claimed in claim 2, further comprising an additional electrical connection to said degenerate layer of semiconductor material to provide a plurality of output voltages from said device each of which is substantially constant.

5. A semiconductor device for providing a substantially constant voltage, comprising a plurality of semiconductor diodes each of which is adapted to operate in its reverse voltage breakdown region; a layer of degenerate semiconductor material sandwiched between adjacent diodes and affixed thereto to provide electrical series connection for said diodes; a first layer of high resistivity semiconductor material crystallographically interconnected to a terminal one of said series of diodes; a second layer of high resistivity semiconductor material crystallographically interconnected to said first high resistivity semiconductor material, in series circuit relationship therewith and physically isolated from said diodes; means for interconnecting said second high resistivity semiconductor layer with said degenerate semiconductor material thereby disposing said second high resistivity material in parallel electrical relationship with one of said diodes; and electrical connections to said layers of high resistivity semiconductor material and to said series of diodes to provide at least one substantially constant output voltage.

6. A semiconductor monocrystalline device for providing a substantially constant voltage, comprising first and second substantially planar layers of substantially single crystalline semiconductor material of opposite conductivity types separated by a substantially planar PN junction, said first and second layers being crystallographically interconnected; a substantially planar semiconductor resistor crystallographically interconnected to one of said first and second layers, said semiconductor resistor having a portion of high resistivity material compared to the resistivity of each of said first and second layers and a layer of low resistivity material compared to said layers forming a surface thereof remote from the interconnected one of said first and second layers; and electrical ohmic connections to said layer of low resistivity material and to each of said first and second layers.

References Cited by the Examiner

UNITED STATES PATENTS

| | | | |
|---|---|---|---|
| 2,681,993 | 1/1954 | Shockley | 317—235 |
| 2,975,085 | 3/1961 | Hunter | 317—235 |
| 2,985,804 | 5/1961 | Buie | 317—235 |
| 3,017,520 | 1/1962 | Maupin | 317—235 |
| 3,018,423 | 1/1962 | Aarons et al. | 317—234 |
| 3,029,366 | 4/1962 | Lehovec | 317—101 |
| 3,047,438 | 7/1962 | Marinace | 148—175 |
| 3,052,822 | 9/1962 | Kilby | 317—234 |
| 3,138,721 | 6/1964 | Kilby | 317—235 |

DAVID J. GALVIN, *Primary Examiner.*

JAMES D. KALLAM, *Examiner.*